(12) United States Patent
Sun

(10) Patent No.: US 8,928,317 B2
(45) Date of Patent: Jan. 6, 2015

(54) SYSTEM AND METHOD FOR CONTROLLING APPARENT TIMING DEPENDENCIES FOR T2-WEIGHTED MRI IMAGING

(75) Inventor: Zhe Phillip Sun, Waltham, MA (US)

(73) Assignee: The General Hospital Corporation, Boston, MA (US)

( * ) Notice: Subject to any disclaimer, the term of this patent is extended or adjusted under 35 U.S.C. 154(b) by 534 days.

(21) Appl. No.: 13/363,526

(22) Filed: Feb. 1, 2012

(65) Prior Publication Data
US 2012/0194188 A1 Aug. 2, 2012

Related U.S. Application Data

(60) Provisional application No. 61/438,463, filed on Feb. 1, 2011.

(51) Int. Cl.
*G01V 3/00* (2006.01)
*G01R 33/483* (2006.01)
*G01R 33/561* (2006.01)

(52) U.S. Cl.
CPC ........ *G01R 33/4838* (2013.01); *G01R 33/5616* (2013.01); *G01R 33/5617* (2013.01)
USPC .......................................... 324/307; 324/309

(58) Field of Classification Search
CPC ................................................. G01R 33/5607
USPC .......................... 324/307, 309, 306, 312, 314
See application file for complete search history.

(56) References Cited

U.S. PATENT DOCUMENTS 8,076,934 B2 * 12/2011 Herzka et al. ................. 324/306
8,148,982 B2 * 4/2012 Witschey et al. ............. 324/309
8,269,494 B2 * 9/2012 Lee et al. ...................... 324/309

* cited by examiner

*Primary Examiner* — Louis Arana
(74) *Attorney, Agent, or Firm* — Quarles & Brady, LLP

(57) ABSTRACT

A system and method for imaging includes applying an RF excitation pulse to a region-of-interest (ROI) in the presence of a first slice selective gradient and applying a readout gradient to acquire a echo signal from the ROI, wherein a time between the RF excitation pulse and the echo signal define an echo time (TE). A saturation module is applied to the ROI including an RF pulse configured to provide a TE-independent steady state and enforcing a predetermined time period ($TR_0$) selected to elapse between the RF pulse of the saturation module and a subsequent application of the RF excitation pulse during repetitions of the above-described portions of the process. An image of the ROI is reconstructed using the acquired echo signals, for example, a $T_2$-weighted image having reduced underestimations of $T_2$ that plague traditional $T_2$-weighted imaging processes using a short TR with a spin-echo (SE) pulse sequence.

18 Claims, 5 Drawing Sheets

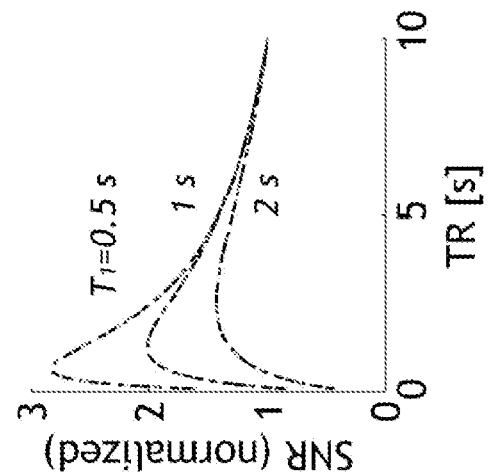
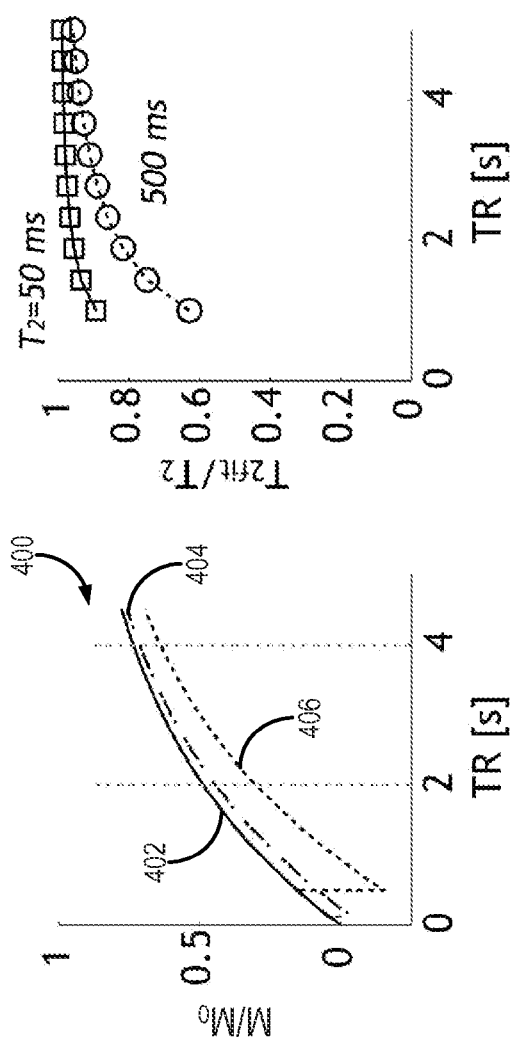

SYSTEM AND METHOD FOR CONTROLLING APPARENT TIMING DEPENDENCIES FOR T2-WEIGHTED MRI IMAGING

CROSS-REFERENCE TO RELATED APPLICATIONS

The present application is based on, claims the benefit of, and incorporates herein by reference U.S. Provisional Application Ser. No. 61/438,463, filed Feb. 1, 2011, and entitled, "SYSTEM AND METHOD FOR CONTROLLING APPARENT TIMING DEPENDENCIES FOR $T_2$-WEIGHTED MRI IMAGING."

STATEMENT REGARDING FEDERALLY SPONSORED RESEARCH

This invention was made with Government support under Grant No. EB009771 awarded by the National Institutes of Health. The Government has certain rights in this invention.

BACKGROUND OF THE INVENTION

The field of the invention is magnetic resonance imaging ("MRI") methods and systems. More particularly, the invention relates to systems and method for controlling repetition time dependencies with respect to $T_2$-weighted MRI imaging.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins," after the excitation signal $B_1$ is terminated, and this signal may be received and processed to form an image.

In MRI systems, the excited spins induce an oscillating sine wave signal in a receiving coil. The frequency of this signal is near the Larmor frequency, and its initial amplitude, $A_0$, is determined by the magnitude of the transverse magnetic moment $M_t$. The amplitude, A, of the emitted NMR signal decays in an exponential fashion with time, t.

An important factor that contributes to the amplitude A of the NMR signal is referred to as the spin-lattice relaxation process that is characterized by the time constant $T_1$. It describes the recovery of the net magnetic moment M to its equilibrium value along the axis of magnetic polarization (z-magnetization). The difference in $T_1$ between tissues can be exploited to provide image contrast.

The decay constant 1/T*2 depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The $T_1$ time constant is longer than $T_2$ and, in fact, the $T_1$ time constant is much longer than $T_2$ in most substances of medical interest.

The practical value of the $T_2$ constant is that tissues have different $T_2$ values and this can be exploited as a means of enhancing the contrast between such tissues. Accordingly, $T_2$ serves as a basic, but very informative MRI parameter, providing non-invasive measurements of tissue status and disease prognosis with respect to a wide range of applications and a host of diseases, including epilepsy, multiple sclerosis (MS), stroke and tumor. In addition, quantitative $T_2$ mapping offers tremendous insights into brain development, iron deposition, and metabolism.

In order to quantify $T_2$, multiple $T_2$-weighted images are acquired and fitted against their echo time (TE), assuming long repetition time (TR) for complete relaxation. In practice, however, a short TR is often desired to minimize scan time. Thus, when looking to quantify $T_2$ and $T_2$-related parameters, the desire to minimize scan time may undermine quantitative $T_2$ measurement. For instance, in a recent study of child-brain development, $T_2$ measurements were found to be two to four times larger than those found in an earlier study and the discrepancy between these findings were at least partially attributable to the choice of different TRs.

Accordingly, given the particular value and versatility of $T_2$ measurements in MRI and the substantial need to minimize scan time, which is in stark competition with traditional mechanisms for optimizing $T_2$-based contrasts and quantifications, it would be desirable to have a system and method for controlling the scan-time dependence of $T_2$-weighted MRI imaging.

SUMMARY OF THE INVENTION

The present invention overcomes the aforementioned drawbacks by providing a fast RF-enforced steady state (FRESS) MRI pulse sequence that saturates the magnetization after the echo and provides a TE-independent steady state. Using the pulse sequence of the present invention, when a short repetition time (TR) is used for spin echo (SE) MRI, it is possible to control the TR and echo time (TE) dependence of steady state magnetization and, thereby, avoid underestimations of $T_2$ that plague traditional $T_2$-weighted imaging processes using a short TR with a SE pulse sequence.

In accordance with one aspect of the invention, a magnetic resonance imaging (MRI) system is disclosed that includes a magnet system configured to generate a polarizing magnetic field about at least a region of interest (ROI) of a subject arranged in the MRI system. The system further includes a plurality of gradient coils configured to apply a gradient field with respect to the polarizing magnetic field and a radio frequency (RF) system configured to apply RF excitation fields to the subject and a acquire MR image data therefrom. The system also includes a computer programmed to control the plurality of gradient coils and the RF system. Accordingly, the computer is programmed to perform the steps of applying an RF excitation pulse to the ROI in the presence of a first slice selective gradient and applying a refocusing RF pulse to the ROI in the presence of a second slice selective gradient. The computer is further programmed to perform the steps of applying a readout gradient to acquire a echo signal from the ROI and applying a saturation module to the ROI including an RF pulse configured to saturate both transverse and longitudinal magnetization in the ROI. The computer is also programmed to perform the steps of enforcing a predetermined time period ($TR_0$) selected to elapse between the RF pulse of the saturation module and a subsequent application of the RF excitation pulse during a repetition of above steps. After performing these steps, the computer is then programmed to reconstruct an image of the ROI using the acquired echo signals.

In accordance with another aspect of the invention, a method for acquiring images of a region of interest (ROI) of a subject using a magnetic resonance imaging system is disclosed that includes applying an RF excitation pulse to the ROI in the presence of a first slice selective gradient and applying a readout gradient to acquire a echo signal from the ROI, wherein a time between the RF excitation pulse and the echo signal define an echo time (TE). The method also includes applying a saturation module to the ROI including an RF pulse configured to provides a TE-independent steady state and enforcing a predetermined time period ($TR_O$) selected to elapse between the RF pulse of the saturation module and a subsequent application of the RF excitation pulse during a repetition of the method. The method also includes reconstructing an image of the ROI using the acquired echo signals.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4A is a graph showing Z-magnetization as a function of repetition time with and without a π pulse in accordance with the present invention;

FIG. 4B is a graph showing the normalized $T_2$ as a function of TR, revealing that underestimation of $T_2$ is particularly severe for the long $T_2$ component at short TR.

FIG. 4C is a graph illustrating SNR as a function of TR.

DESCRIPTION OF THE INVENTION

Figure 1:
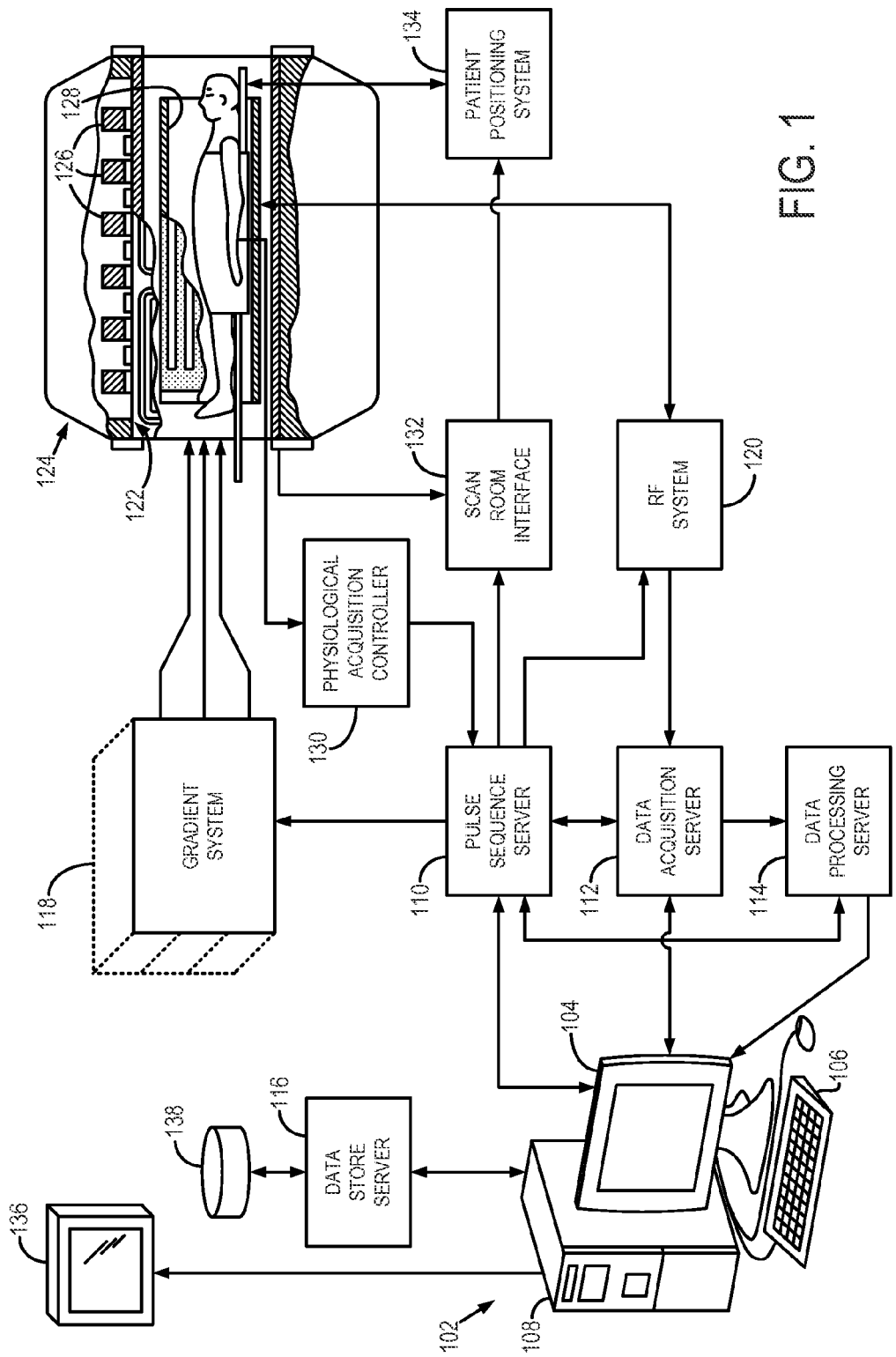
FIG. 1 is a block diagram of an MRI system that employs the present invention.

Referring to FIG. 1, an exemplary MRI system 100 for use with the present invention is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad \text{Eqn. (1)};$$

and the phase of the received MR signal may also be determined:

$$\varphi = \tan^{-1}\left(\frac{Q}{I}\right). \qquad \text{Eqn. (2)}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
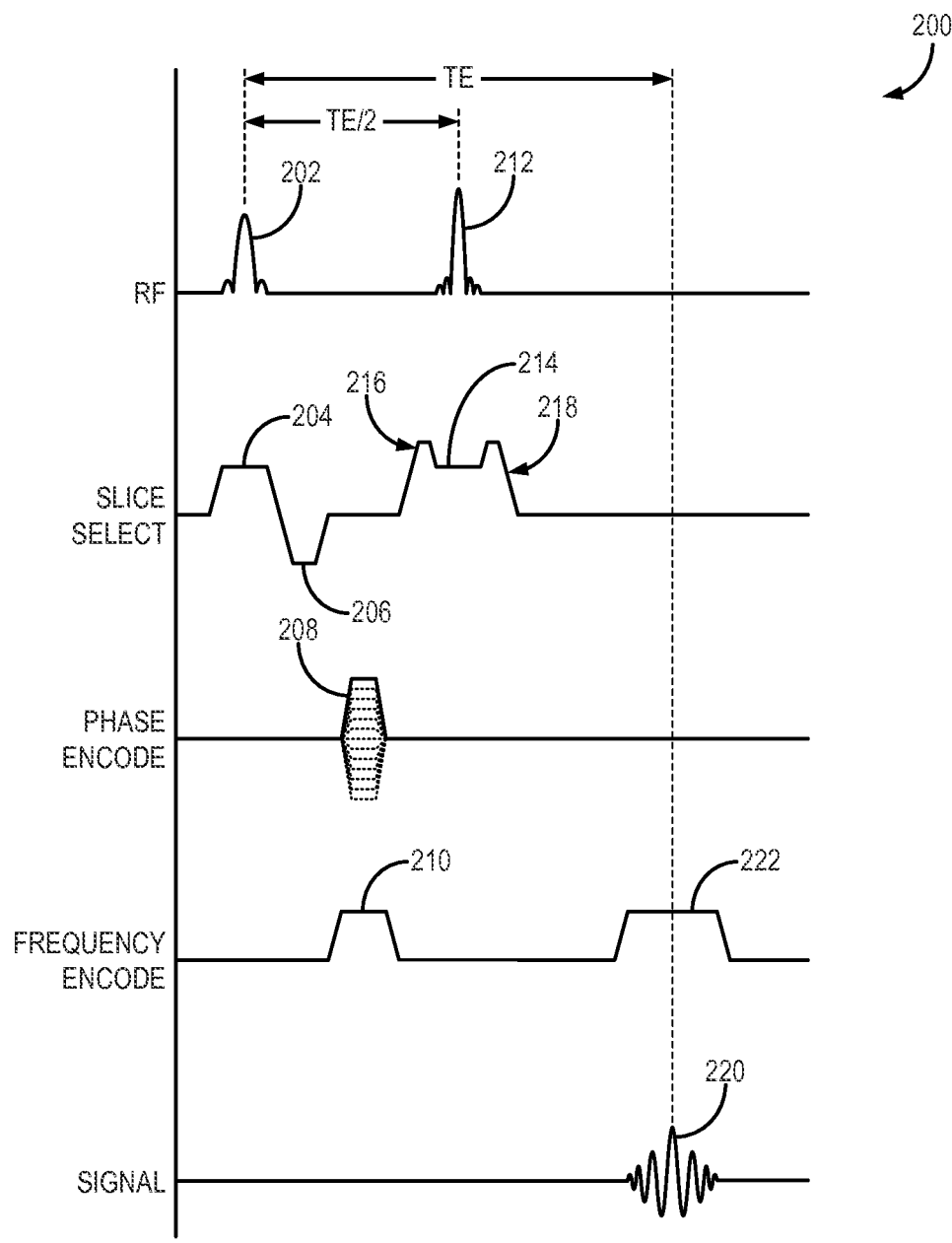
FIG. 2 is a diagram of spin-echo pulse sequence.

In attempting to better understand the scan-time dependence of $T_2$-weighted MRI imaging, Z-magnetization evolution of conventional spin-echo (SE) MRI pulse sequences can be examined. The recovery of the Z-magnetization occurs with the $T_1$ relaxation time and typically at a much slower rate than the $T_2$-decay, because in general $T_1 \gg T_2$. Thus, the signal intensity measured is related to the square of the XY-magnetization. Initially, referring to FIG. 2, a pulse sequence diagram 200 for a spin-echo pulse sequence is illustrated. As illustrated, the spin-echo pulse sequence 200 includes an RF excitation pulse 202 that is played out in the presence of a slice selective gradient 204. After the RF excitation pulse 202, Z-magnetization recovers from zero to equilibrium as $M(TE/2,T_1)=M_0(1-e^{-(TE/2)/T_1})$, where $M_0$ is the thermal equilibrium Z-magnetization.

To mitigate signal losses resulting from phase dispersions produced by the slice selective gradient 204, a rephasing lobe 206 is applied after the slice selective gradient 204. Next, a refocusing RF pulse 212 is applied following a phase encoding gradient 208 and associated readout gradient 210.

The Z-magnetization is inverted by the refocusing pluse 212 and the steady state Z-magnetization ($M_{ss}$) can be shown as:

$$M_{SS}(TR, TE, T_1) = -M_0(1 - e^{-(TE/2)/T_1})e^{-(TR-(TE/2))/T_1} + \quad \text{Eqn. (3)}$$
$$M_0(1 - e^{-(TR-(TE/2))/T_1})$$
$$= M_0(1 - e^{-(TR-(TE/2))/T_1}(2 - e^{-(TE/2)T_1}))$$
$$= M_0(1 + e^{-TR-T_1} - 2e^{-(TR-(TE/2))T_1}).$$

In order to substantially reduce unwanted phase dispersions, along with the refocusing pulse 212, a first crusher gradient 216 bridges the slice selective gradient 214 with a second crusher gradient 218. A spin-echo MR signal 220 is acquired during the application of a readout gradient 222. As is known in the art, the pulse sequence 200 may be repeated a plurality of times while stepping the phase encoding gradient 208 through a plurality of different values. This process may then be repeated with different slice selective gradients 204, 214 so as to acquire image data from different slice locations. Accordingly, the TR is defined as the time between RF excitation pulses 202 and the TE is the time between the RF excitation pulse 202 and the spin echo 220.

If TE is significantly shorter than TR, the TE dependence of the steady state can be reasonably ignored, and $T_2$ can be derived by fitting the signal intensity as a function of TE, as given by $M(TE,T_2)=M_{SS}(TR,T_1)e^{-TE/T_2}$. Conversely, when TE is not negligible, the image intensity can be described by $M(TR,TE,T_1,T_2)=M_{SS}(TR,TE,T_1)e^{-TE/T_2}$. In fact, as shown by Eqn. 3, the steady state itself decreases with TE, which if not properly accounted for will be mistaken as $T_2$-induced signal attenuation and lead to a $T_2$ underestimation.

As will be described, the present invention provides a modified pulse sequence, for example when compared to a SE pulse sequence, referred to herein as a fast radio frequency enforced steady state (FRESS) pulse sequence, that saturates the magnetizations after the spin echo so that spins recover from 0 until the next excitation pulse ($TR_0$), and the steady state magnetization becomes $M_{SS}(TR_0,T_1)=M_0(1-e^{-TE/T_1})$. Accordingly, the steady state magnetization using the FRESS pulse sequence of the present invention becomes independent of TE, provided that $TR_0$ is kept as constant, and $T_2$ can be obtained without erroneous underestimation from numerical fitting.

Figure 3A:
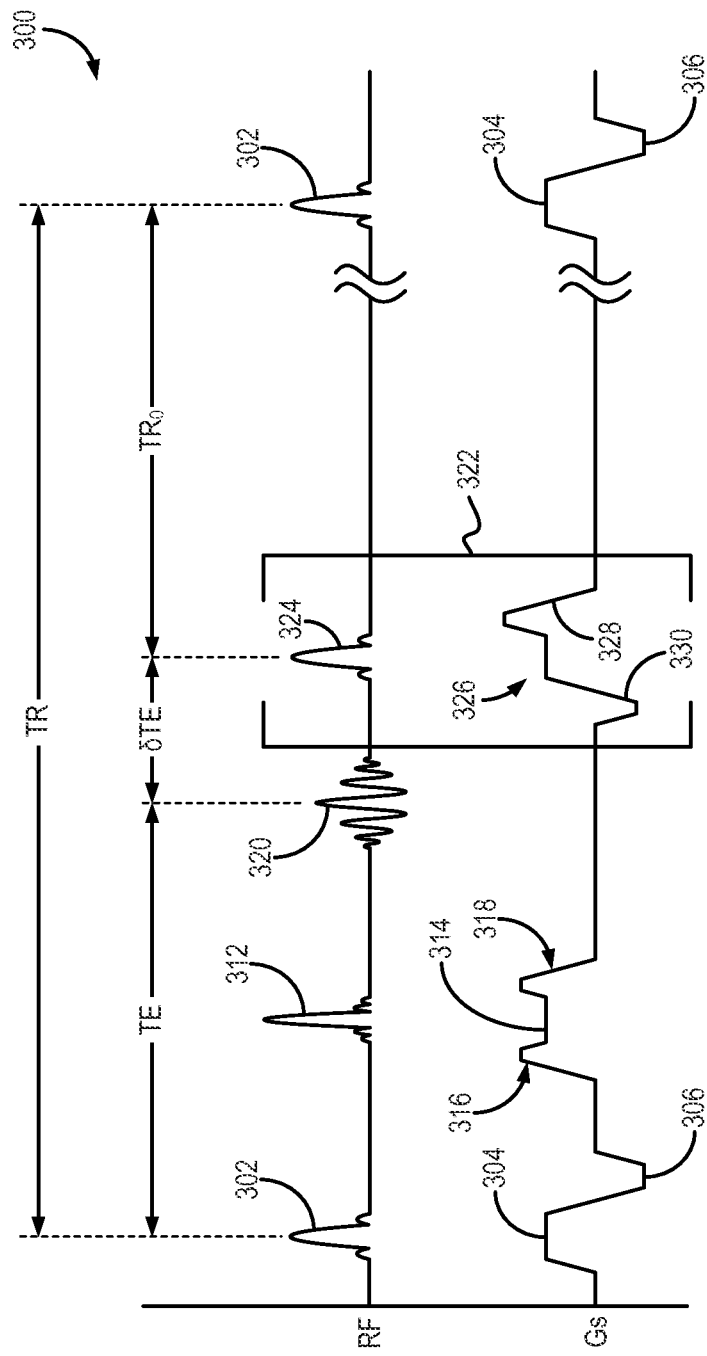
FIG. 3A is a diagram of a fast radio frequency enforced steady state (FRESS) pulse sequence in accordance with the present invention and for use with the system of FIG. 1.

Specifically, referring to FIG. 3A, a diagram of an example of a FRESS SE pulse sequence 300 is illustrated. Like a traditional SE pulse sequence, the FRESS SE pulse sequence 300 includes an RF excitation pulse 302 that is played out in the presence of a slice selective gradient 304. To mitigate signal losses resulting from phase dispersions produced by the slice selective gradient 304, a rephasing lobe 306 is applied after the slice selective gradient 304. A refocusing RF pulse 312 is applied and, in order to substantially reduce unwanted phase dispersions, a first crusher gradient 316 bridges the slice selective gradient 314 with a second crusher gradient 318. A spin-echo MR signal 320 is acquired during the application of a readout gradient. It is noted that an echo planner imaging (EPI) readout may be used for image readout, for example, so $T_2$ measures can be obtained with a single echo technique.

Unlike traditional SE pulse sequences, the FRESS pulse sequence 300 includes a saturation module 322 that includes a slice-selective RF pulse 324, for example a 90 degree RF pulse, and associated crusher module 326. To mitigate the RF inhomogeneity artifacts, composite slice-selective RF pulses can be applied in the saturation module 322 instead of the illustrated 90 degree slice-selective RF pulse. Alternately, multiple π/2 pulses with alternated phase sandwiched by crusher gradients, or the like may be used. As will be explained, the saturation module 322 is designed to saturate both transverse and longitudinal magnetization.

As with traditional SE pulse sequences, the TR is defined as the time between RF excitation pulses 302 and the TE is the time between the RF excitation pulse 302 and the spin echo 320. It is noted that the effective TR is actually the length of time between the refocusing pulse and start of the next sequence, not the total length of the sequence, TR. Data collected with a series of single echo acquisitions at different TE times, but with a fixed TR, will be subject to a range of effective TR times. In clinical applications, if this is not accounted for, the $T_2$ estimation will not necessarily be accurate.

In the FRESS pulse sequence 300, the slice-selective RF pulse 324 of the saturation module 322 serves to define another value, $TR_0$, which is the time between the adjacent RF pulses of the slice-selective RF pulse 324 of the saturation module 322 and the subsequent RF excitation pulse 302. It is important to note that $TR_0$ may be advantageously kept constant in order to reach the same steady state. However, to achieve this, a number of considerations must be made and the pulse sequence specifically designed to account for the considerations.

Figure 3B:
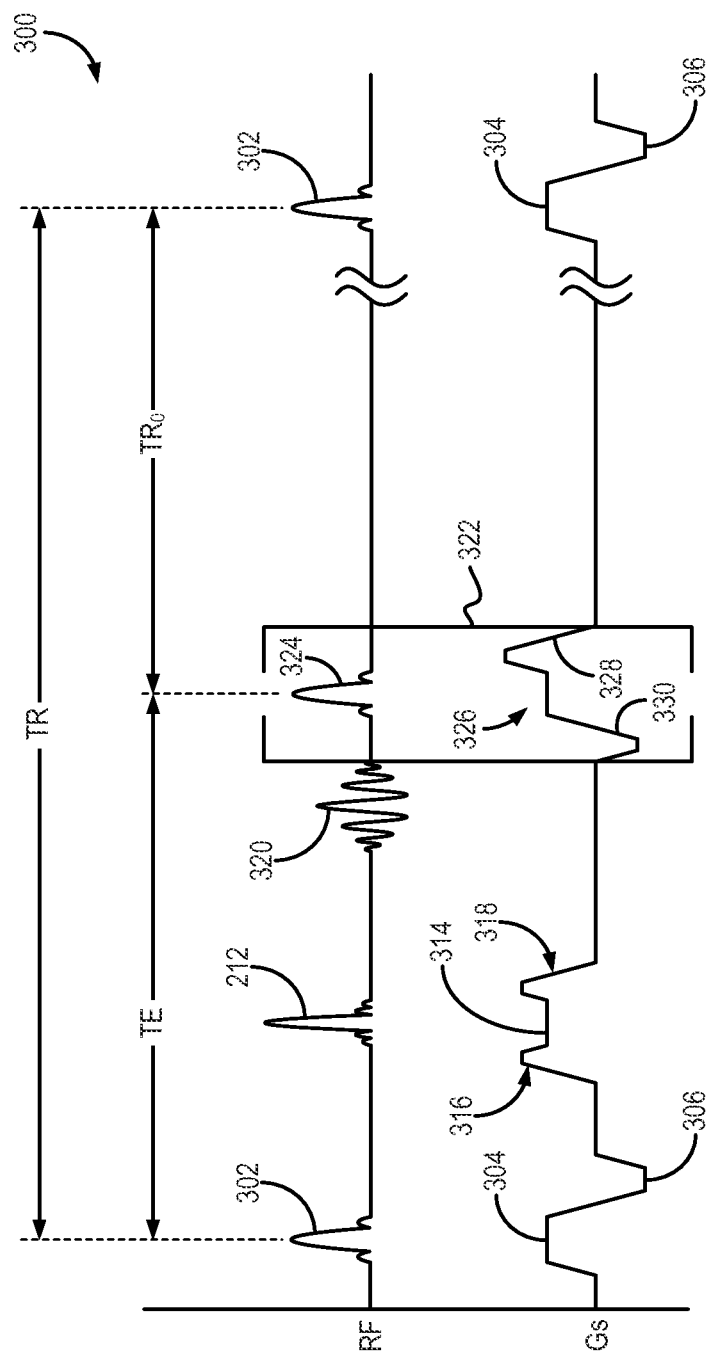
FIG. 3B is a diagram of another FRESS pulse sequence in accordance with the present invention and for use with the system of FIG. 1.

In accordance with one aspect of the present invention, a filler TE (δTE) may be designed and inserted so that the sum of the TE and filler TE (TE+δTE) remains constant to thereby achieve a fixed TR and $TR_0$. For example, in the configuration illustrated in FIG. 3, the slice-selective RF pulse 324 and crusher module 326 follow the spin echo 320 such that the slice-selective RF pulse 324 is sandwiched by two crusher gradient pulses 328, 330. In accordance with another aspect of the present invention and referring to FIG. 3B, the saturation module 322 can be applied immediately after the spin echo 320, resulting in a fixed $TR_0$, but variable TR.

To illustrate the advantages of the present invention, the magnetization evolution of the conventional SE MRI for two representative $T_2$ values of 50 and 500 ms; $T_1$=3 s can be tracked. As shown in FIG. 4A, three Z-magnetizations can be plotted in a graph of magnetization versus TR 400. The first data set 402 was acquired without a refocusing π pulse. The second data set 404 and the third data set 406 were acquired with a π pulse, applied at 12.5 ms (dashed) and 500 ms (dotted), respectively. The plot shows of FIG. 4A show that the Z-magnetization steady state depends not only on TR but also TE. If the refocusing pulse-induced loss of steady state magnetization (TE dependence) is not properly taken into account, it may be mistaken as $T_2$-induced signal attenuation, and therefore cause an underestimation of $T_2$.

Referring to FIG. 4B, $T_2$-weighted signals can be simulated by varying TE from 50 to 500 ms in 10 steps and $T_2$ measurements can be obtained by numerical fitting, assuming a mono-exponential function. As illustrated in FIG. 4B, the measured $T_2$ values decreased with short TR, particularly for the long $T_2$ component. This decrease in $T_2$ occurred because for a given TE, the $T_2$-induced signal decay for the long $T_2$ component is less than that for the short $T_2$ component, and therefore, is more susceptible to the refocusing π pulse-induced loss of steady state Z-magnetization.

For the conventional SE MRI, the Z-magnetization at TE can be shown as $M(TE,T_1)=M_0(1-e^{-TE/2T_1})^2$. On the other hand, using the FRESS pulse sequence, the Z-magnetization simplifies as $M(TE)=0$. As such, the saturation module 322 of FRESS pulse sequence of FIGS. 3A and 3B, only marginally reduces the steady state Z-magnetization. The steady state magnetization with TR from 0.1 to 10 s can be simulated, for three representative $T_1$ values, 0.5, 1 and 2 s, and assuming a typical $T_2$ of 100 ms, with two TEs, 50 and 100 ms. The normalized signal to noise ratio (SNR) per time can be calculated as follows:

$$SNR_{norm} = \frac{M_{SS}(TR)/\sqrt{TR}}{M_{SS}(TR_\infty)/\sqrt{TR_\infty}};\qquad \text{Eqn. (4)}$$

in which the SNR at a long TR serves as the reference ($TR_\infty$=10 s). For FRESS pulse sequence 300 illustrated in FIG. 3B, with $TR_0$=TR-mean (TE), FIG. 4C provides a graph of $SNR_{norm}$ for a conventional SE spin echo pulse sequence (black dashed dotted line) and the FRESS pulse sequence (gray dashed), with very little difference. Thus, despite the use of a saturation module, the sensitivity of the FRESS pulse sequence of the present invention is comparable to that of the conventional SE pulse sequences. In addition, FIG. 4C shows that SNR per time is highest at an optimal TR comparable to $T_1$ ($TR_{optimal}$~1.26 $T_1$), which suggests the need to correct the TR dependence of $T_2$ mapping so the sensitivity of $T_2$ MRI can be optimized.

It is contemplated that the FRESS pulse sequence in accordance with the present invention can accurately measure $T_2$ in multi-compartment systems, such as when combining image signals from three sets of two separate ROIs each, and obtaining respective $T_2$ measures with a multi-, in this case bi-, exponential fitting. In tests, the $T_2$ measurements derived from bi-exponential fitting was found to agree well with those obtained from mono-exponential fitting of each compartment independently. In addition, the FRESS pulse sequence in accordance with the present invention retained its advantage of little TR dependence.

Comparison of single- and multi-slice $T_2$ quantification showed that the FRESS pulse sequence in accordance with the present invention is consistently equal to or higher than conventional SE MRI. In addition, very little difference in $T_2$ measurements were found between single- and multi-slice acquisitions, suggesting negligible magnetization transfer (MT) effect with multi-slice acquisition.

To assess the sensitivity of the FRESS pulse sequence in accordance with the present invention, the coefficient of variation (CV) for both the FRESS pulse sequence and conventional SE MRI can be calculated. Mean CV of $T_2$ measured by the FRESS pulse sequence of the present invention was found to be comparable to that obtained with conventional SE MRI. Finally, it is noted that the RF field of the present measurements had been calibrated with a double angle method (DAM), with its field homogeneity being 100±6% (mean±S.D.). However, we found no $B_1$-inhomogeneity artifacts in the $T_2$ maps produced using the FRESS pulse sequence in accordance with the present invention, suggesting that subtle $B_1$ inhomogeneity effect can be reasonably compensated with composite RF pulses or alternative RF saturation scheme, as described above.

As described above, it is contemplated that EPI may be used for image readout so $T_2$ measures can be obtained with single echo technique and, in accordance with the present invention, TR can be significantly reduced without affecting the accuracy of $T_2$ measurements. As such, the total scan time for $T_2$ mapping using the FRESS pulse sequence is relatively short when compared to traditional SE/EPI pulse sequences. For instance, for a dual echo MRI with an image matrix size of 64×64, assuming a TR of 2 s, the imaging takes 128 s. With a single-shot EPI readout, the same amount of acquisition time permits multi-slice/3-D acquisition and signal averaging.

Therefore, as described above, for single compartment system, the FRESS pulse sequence in accordance with the present invention eliminates the TR dependence. In addition, similar $T_2$ values can be obtained using the FRESS pulse sequence with bi-exponential fitting of signals combined from multi-compartments, suggesting the broad applicability of the present invention to clinical applications. For example, by providing fast and accurate $T_2$ measurement, the FRESS pulse sequence in accordance with the present invention can improve characterization studies of tissue metabolic status by determining measures such as altered oxygen extraction ratio (OER) during stroke, and thus may complement commonly used perfusion and diffusion scans. With respect to neurological studies, although a simplified mono-exponential decay function was described above, there may be non-negligible partial volume effect in the brain, which may potentially complicate in vivo $T_2$ quantification in the brain. Nevertheless, such effects may be reasonably addressed by choosing multi-exponential fitting or imaging at higher spatial resolution.

Whereas TR may affect the relative amplitudes of components, the FRESS pulse sequence of the present invention simplifies the TR-dependence for multi-pool system by removing TE-induced, TR-dependent measurement errors, thereby limiting the TR dependence to an amplitude modulation through relaxation recovery. Although conventionally long TR is necessary when a specimen of broad $T_2$ distribution is being imaged, the FRESS pulse sequence of the present invention is capable of quantifying $T_2$ with very short TR; hence, allowing clinicians to minimize the scan time.

Also, it is noted that, because the TE-dependent steady state varies with $T_1$, the $T_2$ mapping errors described-above when using conventional SE MRI is particularly severe when $T_2/T_1$ is large. Given that the $T_2/T_1$ ratio is typically higher at lower field strength, clinical scans acquired at the extremely-common field strength of 1.5 T (and below) may be more susceptible to error than scans acquired at higher field strengths.

Therefore, present invention is built upon a realization and, more importantly, a modeled and mathematically precise explanation of the phenomenon of TR dependence in $T_2$ measurements with respect to SE MRI. Building upon this elucidation, the present invention provides a system for implementing and method for fast and accurate $T_2$ measurements, referred to as the FRESS pulse sequence. As described herein, the FRESS pulse sequence has been validated both numerically and experimentally, and is suitable for a wide variety of in vivo applications to provide clinical benefits not achievable by traditional pulse sequences, such as traditional SE and fast SE pulse sequences.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
    a magnet system configured to generate a polarizing magnetic field about at least a region of interest (ROI) of a subject arranged in the MRI system;
    a plurality of gradient coils configured to apply a gradient field with respect to the polarizing magnetic field;
    a radio frequency (RF) system configured to apply RF excitation fields to the subject and a acquire MR image data therefrom; and
    a computer programmed to control the plurality of gradient coils and the RF system to perform the following steps:
    a) apply an RF excitation pulse to the ROI in the presence of a first slice selective gradient;
    b) apply a refocusing RF pulse to the ROI in the presence of a second slice selective gradient;
    c) apply a readout gradient to acquire a echo signal from the ROI;
    d) apply a saturation module to the ROI including an RF pulse configured to saturate both transverse and longitudinal magnetization in the ROI;
    e) enforce a predetermined time period ($TR_0$) selected to elapse between the RF pulse of the saturation module and a subsequent application of the RF excitation pulse during a repetition of steps a) through d);
    f) repeat steps a) through e) a plurality of times; and
    g) reconstruct an image of the ROI using the acquired echo signals.

2. The system of claim 1 wherein the computer is further programmed to maintain $TR_0$ as a constant through repetitions of steps a) through e).

3. The system of claim 1 wherein the reconstructed image is a $T_2$-weighted image and the computer is further programmed to perform step d) at a time between steps c) and e) to control repetition time dependencies with respect to the $T_2$-weighted image.

4. The system of claim 1 wherein the computer is further programmed to apply the saturation module of step d) to saturate magnetization in the ROI to provide an echo-time-(TE) independent steady state.

5. The system of claim 1 wherein the computer is further programmed to enforce a filler TE ($\delta TE$) between steps c) and d) having a duration so that the sum of a TE and the filler TE (TE+$\delta TE$) is constant during step f) to thereby achieve a constant repetition time (TR) and $TR_0$.

6. The system of claim 1 wherein the computer is further programmed to apply crusher gradient pulses coordinated with the RF pulse of the saturation module.

7. The system of claim 1 wherein the computer is further programmed to apply the RF pulse of the saturation module as a slice-selective RF pulse.

8. The system of claim 1 wherein the computer is further programmed to apply the saturation module immediately after receiving the echo signal.

9. The system of claim 1 wherein the computer is further programmed to perform the readout gradient as an echo planner imaging (EPI) readout and wherein the echo signal includes a spin-echo signal.

10. The system of claim 1 wherein the ROI includes a multi-compartment system and the computer is further programmed to obtain respective $T_2$ measures for each compartment within the multi-compartment system using multi-exponential fitting.

11. A method for acquiring images of a region of interest (ROI) of a subject using a magnetic resonance imaging system, the method comprising the steps of:
    a) applying an RF excitation pulse to the ROI in the presence of a first slice selective gradient;
    b) applying a readout gradient to acquire a echo signal from the ROI, wherein a time between the RF excitation pulse and the echo signal define an echo time (TE);
    c) applying a saturation module to the ROI including an RF pulse configured to provides a TE-independent steady state;
    d) enforcing a predetermined time period ($TR_0$) selected to elapse between the RF pulse of the saturation module and a subsequent application of the RF excitation pulse during a repetition of steps a) through d);
    e) repeating steps a) through d) a plurality of times; and
    f) reconstructing an image of the ROI using the acquired echo signals.

12. The method of claim 11 wherein the RF pulse of the saturation module is configured to saturate both transverse and longitudinal magnetization in the ROI.

13. The method of claim 11 wherein $TR_0$ is maintained as a constant through step e).

14. The method of claim 11 further comprising enforcing a filler TE ($\delta TE$) between steps b) and c) having a duration selected so that the sum of the TE and the filler TE (TE+$\delta TE$) is constant during step e) to thereby achieve a constant repetition time (TR) and $TR_0$ to control TR dependencies with respect to $T_2$-weighting in the reconstructed image.

15. The method of claim 11 wherein step c) includes applying crusher gradient pulses coordinated with the RF pulse of the saturation module.

16. The method of claim 11 wherein step c) is performed immediately after receiving the echo signal in step b).

17. The method of claim 11 wherein step b) includes performing an echo planner imaging (EPI) readout.

18. The method of claim 11 wherein the ROI includes a multi-compartment system and further comprising obtaining respective $T_2$ measures for each compartment within the multi-compartment system using multi-exponential fitting.

* * * * *